(12) United States Patent
Shimada et al.

(10) Patent No.: US 6,473,293 B2
(45) Date of Patent: Oct. 29, 2002

(54) CAPACITOR UNIT, METHOD FOR PRODUCING THE SAME, AND SOLID ELECTROLYTIC CAPACITOR

(75) Inventors: Mikinari Shimada, Kyoto; Yasuhiko Nakada, Osaka; Seiichi Nakatani, Osaka; Seigo Shiraishi, Osaka; Hiroyuki Handa, Osaka, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/976,381

(22) Filed: Oct. 11, 2001

(65) Prior Publication Data

US 2002/0097550 A1 Jul. 25, 2002

(30) Foreign Application Priority Data

Oct. 12, 2000 (JP) ........................................ 2000-311603

(51) Int. Cl.[7] .............................. H01G 9/00; H01G 9/04
(52) U.S. Cl. ........................ 361/523; 361/532; 29/25.03
(58) Field of Search ................................ 361/516, 517, 361/522, 523, 530, 532; 29/25.03

(56) References Cited

U.S. PATENT DOCUMENTS

| | | | |
|---|---|---|---|
| 4,166,286 A | * | 8/1979 | Boissonnault ............... 361/532 |
| 4,184,192 A | * | 1/1980 | Yoshida et al. ............. 252/514 |
| 5,005,107 A | * | 4/1991 | Kobashi et al. ............. 361/540 |
| 5,122,931 A | | 6/1992 | Shimada et al. |
| 6,310,765 B1 | * | 10/2001 | Tanahashi et al. .......... 361/503 |

FOREIGN PATENT DOCUMENTS

| | | |
|---|---|---|
| EP | 886 288 | 12/1998 |
| JP | 62-189716 | 8/1987 |
| JP | 1-296608 | 11/1989 |
| JP | 4-48616 | 2/1992 |
| JP | 4-243116 | 8/1992 |
| JP | 6-204094 | 7/1994 |
| JP | 11-26320 | 1/1999 |
| JP | 11-219861 | 8/1999 |

* cited by examiner

Primary Examiner—Anthony Dinkins
(74) Attorney, Agent, or Firm—Merchant & Gould P.C.

(57) ABSTRACT

A capacitor unit of the present invention is configured so that a dielectric layer is provided on a roughened surface of a valve metal foil for an anode, and further, a conductive layer for a cathode, and a charge collecting metal element for a cathode are provided thereon in the stated order. The conductive layer for a cathode has a three-layer structure including a first conductive polymer layer, a conductive adhesive layer, and a second conductive polymer layer that are laminated in the stated order from the dielectric layer side. The capacitor unit of the present invention is produced by laminating the first conductive polymer layer formed on a side of the valve metal foil for an anode, and the second conductive polymer layer formed on a side of the charge collecting metal element for a cathode, with a conductive adhesive layer being interposed therebetween, and compressing the same in a lamination direction.

9 Claims, 3 Drawing Sheets

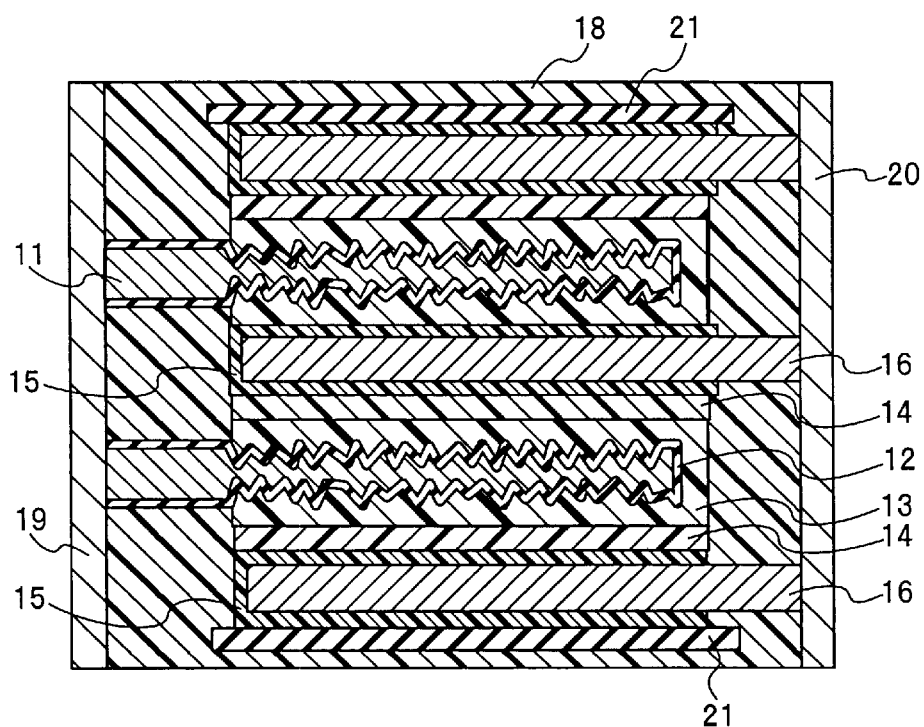
F I G. 3
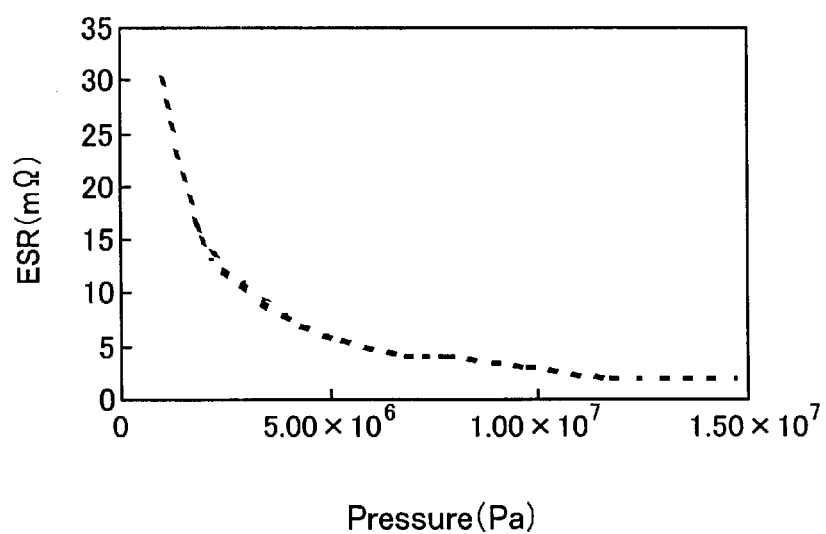
F I G. 4

PRIOR ART

CAPACITOR UNIT, METHOD FOR PRODUCING THE SAME, AND SOLID ELECTROLYTIC CAPACITOR

BACKGROUND OF THE INVENTION

1. Field of the Invention

The present invention relates generally to a capacitor unit included in an electrolytic capacitor used in a high-speed power source circuit, and to a method for producing the same.

2. Related Background Art

Conventionally, an electrolytic capacitor in which a valve metal such as aluminum or tantalum is used, and a multilayer ceramic capacitor in which Ag/Pd or Ni is used for electrodes and barium titanate is used as a dielectric, have been known as capacitors. These capacitors are used in most power source circuits. Recently, since CPU driving circuits and switching power source circuits particularly are required to be driven with a lower driving voltage, to consume less power, and to be suitable for high frequencies, a capacitor also is required to have a large capacitance, a low equivalent series resistance (hereinafter referred to as ESR), and a low equivalent series inductance (hereinafter referred to as ESL). To meet with these requirements, particularly for a capacitor to have a low ESR, a technique in which a specialty polymer having a high electroconductivity (conductive polymer) is used as the solid electrolyte for the cathode has been examined and developed.

A configuration of a conventional specialty polymer aluminum electrolytic capacitor is described below, with reference to FIG. 5. FIG. 5 is a cross-sectional view of a conventional specialty polymer aluminum electrolytic capacitor. In FIG. 5, 101 denotes an aluminum foil for an anode (hereinafter referred to as anode-use aluminum foil). 102 denotes a dielectric layer. 103 denotes a conductive polymer layer. 104 denotes a carbon layer. 105 denotes an Ag paste layer. 106 denotes an anode terminal. 107 denotes a cathode terminal. 108 denotes a molding resin.

The anode-use aluminum foil 101 has been treated so as to have rough surfaces, and is provided with the dielectric layer 102 on the surfaces. On the surfaces of the anode-use aluminum foil 101 provided with the dielectric layer 102, the conductive polymer layer 103 made of polypyrrole, polythiophene, polyaniline, etc. is formed. Furthermore, on the conductive polymer layer 103, the carbon layer 104 and the Ag paste layer 105 are formed in the stated order, so that a conventional capacitor unit is provided. Further, the anode terminal 106 and the cathode terminal 107 are bonded with the foregoing conventional capacitor unit, and the capacitor unit is sealed with the molding resin 108. Thus, the conventional specialty polymer aluminum electrolytic capacitor is formed.

Such a conventional specialty polymer aluminum electrolytic capacitor has a lower ESR than that of an electrolytic capacitor using an electrolytic solution as electrolyte (hereinafter referred to as an electrolytic solution-type electrolytic capacitor). To further increase the capacitance and decrease the ESR, however, a configuration in which a plurality of conventional capacitor units are laminated with an Ag adhesive (Ag adhesive paste) has been developed. Furthermore, as to the foregoing conventional capacitor unit, to decrease the ESR thereof further, materials for the conductive polymer layer 103, the carbon layer 104, and the Ag paste layer 105 have been developed.

Furthermore, to decrease the ESR further, conventionally, another capacitor unit has been proposed in which a cathode-use aluminum foil on which a dielectric layer, and a metallic element that functions as a charge collector for the cathode (hereinafter referred to as cathode-use charge collecting metallic element) are bonded with each other with only a conductive polymer layer provided therebetween (JP11(1999)-219861A).

However, a specialty polymer aluminum electrolytic capacitor having the above-described conventional capacitor unit undergoes drawbacks as described below.

First of all, it is difficult to decrease the ESR of the conventional specialty polymer aluminum electrolytic capacitor to as low a level as that of the multilayer ceramic capacitor, and it cannot be achieved sufficiently by decreasing specific resistances of the conductive polymer layer, the carbon layer, and the Ag paste layer. This is evident from the fact that, in the case where an electrolytic capacitor using a specialty polymer is compared with an electrolytic solution-type electrolytic capacitor, the specialty polymer has a degree of conductivity that is two or more digits greater than that of the electrolytic solution, but the electrolytic capacitor using the specialty polymer has an ESR that is only one digit or the like smaller than that of the electrolytic-solution-type electrolytic capacitor. In other words, it is necessary to develop a technique other than that for lowering of the specific resistances of the materials, that is, to develop a technique for reducing various interface resistances at an interface between a conductive polymer layer and a carbon layer, at an interface between a carbon layer and an Ag paste layer, and the like to cause an electrolytic capacitor using a specialty polymer to have an ESR that is as low as that of a multilayer ceramic capacitor.

On the other hand, in the case where an anode-use aluminum foil and a cathode-use charge collecting metallic element are bonded with each other via a conductive polymer layer, interfaces are fewer in number as compared with the foregoing case, and hence it is possible to obtain a further lower ESR. In this case as well, however, a drawback arises in that a producing process is complex, since the producing process requires the following step: a step of assembling an anode-use aluminum foil on which a dielectric layer is formed and a cathode-use charge collecting metallic element so that they are facing each other, and filling a space between the anode-use aluminum foil and the cathode-use charge collecting metallic element with a conductive polymer for bonding use so that a layer of the conductive polymer is obtained in the space; or a step of assembling the cathode-use charge collecting metallic element and an anode-use aluminum electrolytic foil in the vicinity so that they are facing each other, and placing the same in an electrolytic solution so that a conductive polymer layer is formed from the cathode-use charge collecting metallic element side by electrolytic polymerization.

SUMMARY OF THE INVENTION

It is an object of the present invention to provide a capacitor unit in which respective interface resistances at interfaces between layers are decreased without complex processes so as to obtain as low an ESR as that of a multilayer ceramic capacitor, a method for producing the same, and an electrolytic capacitor in which the same is used.

To achieve the foregoing object, a capacitor unit of the present invention includes a valve metal element for an anode that has a rough surface, a dielectric layer provided on the surface of the valve metal element for the anode, a conductive layer for a cathode, provided on the dielectric layer, and a charge collecting metal element for the cathode provided on the conductive layer for the cathode, wherein the conductive layer for the cathode includes three layers that are a first conductive polymer layer, a second conductive polymer layer, and a conductive adhesive layer interposed between the first and second conductive polymer layers.

Thus, in the capacitor unit of the present invention, the conductive layer for cathode has a three-layer structure. Besides, the first conductive polymer layer and the second conductive polymer layer are provided on the valve metal element for the anode and the charge collecting metal element for the cathode, respectively, and the first and second conductive polymer layers are made to adhere to each other with the conductive adhesive layer. Therefore, upon integrally providing the components into a capacitor unit, the first conductive polymer layer and the second conductive polymer layer may be provided beforehand on the valve metal element for the anode and the charge collecting metal element for the cathode, respectively, and laminated on each other with the conductive adhesive layer interposed therebetween, while being compressed in the lamination direction. By thus compressing the same, contact areas between layers, for instance between the charge collecting metal element and the second conductive polymer layer, are increased. Therefore, various interface resistances, for instance, an interface resistance between the charge collecting metal element for the cathode and the second conductive polymer layer, can be decreased.

Furthermore, the first and second conductive polymer layers are made of relatively soft materials. Therefore, in the configuration in which the conductive adhesive layer is interposed between the first and second conductive polymer layers, the contact areas between the three layers are large, and interface resistances are suppressed to a low level. Therefore, a resistance in the conductive layer for the cathode composed of the foregoing three layers also is suppressed to a low level. Furthermore, with sufficient compression upon integration into the capacitor unit, the resistance in the conductive layer for cathode can be suppressed to a still lower level.

Furthermore, by providing the conductive adhesive layer, it is possible to prevent the first and second conductive polymer layers from being separated from each other, and hence, to maintain the same stably with increased contact areas.

As described above, the configuration of the present invention ensures reduction of interface resistances between the respective layers, thereby achieving decreased ESR.

Furthermore, in the capacitor unit of the present invention, the conductive adhesive layer preferably is made of a thermosetting resin in which conductive particles are dispersed.

Furthermore, in the capacitor unit of the present invention, the valve metal element for the anode preferably is made of one of an aluminum foil, a tantalum foil, and a niobium foil.

Furthermore, in the capacitor unit of the present invention, the cathode charge collecting metal element for the cathode preferably is made of a metal foil in which carbon particles are embedded so as to be exposed on the surface of the metal foil. This configuration suppresses an interface resistance between the charge collecting metal element for the cathode and the second conductive polymer layer, thereby allowing the ESR to be lowered further.

Furthermore, a method for producing the capacitor unit of the present invention includes the steps of: forming the first conductive polymer layer on the dielectric layer formed on the surface of the valve metal element for the anode; forming the second conductive polymer layer on a surface of the charge collecting meal element for the cathode; applying a conductive adhesive over at least one of the first conductive polymer layer and the second conductive polymer layer; and laminating the valve metal element for the anode and the charge collecting metal element for the cathode so that the first conductive polymer layer and the second conductive polymer layer face each other via the conductive adhesive, and curing the conductive adhesive in a state of being compressed in a lamination direction.

This method allows interface resistances between the layers to decrease, thereby decreasing the ESR, without complex processes. It should be noted that effects of the compression are as described above.

To achieve the aforementioned object, an electrolytic capacitor of the present invention includes the aforementioned capacitor unit, a molding material for molding the capacitor unit, an anode terminal connected with the valve metal element for the anode, and a cathode terminal connected with the charge collecting metal element for the cathode.

Since the electrolytic capacitor of the present invention includes the capacitor unit of the present invention with which the ESR can be lowered, in the electrolytic capacitor, it is possible to obtain as low an ESR as that of a multilayer ceramic capacitor.

Furthermore, the electrolytic capacitor of the present invention may include a plurality of the capacitor units that are laminated, thereby constituting a capacitor unit lamination.

Furthermore, in the electrolytic capacitor of the present invention, elastic bodies preferably are provided between the upper and lower surfaces of either the capacitor unit or the capacitor unit lamination on one hand, and the molding material on the other hand. With this configuration, even after packaging, because of the elastic bodies, a compressing force is exerted on the capacitor unit or the capacitor unit lamination in the lamination direction. Therefore, stable interface connections are achieved.

These and other objects, characteristics, and advantages will be fully revealed by the following description. The benefits of the present invention will become apparent to those skilled in the art upon reading and understanding the following detailed description with reference to the accompanying figures.

BRIEF DESCRIPTION OF THE DRAWINGS

FIG. 3 is a cross-sectional view illustrating a schematic configuration of a solid electrolytic capacitor according an embodiment of the present invention.

FIG. 4 is a diagram showing the relationship between an applied pressure and an ESR at a conductive adhesive bonding.

DETAILED DESCRIPTION OF THE INVENTION

The following description will depict an embodiment of the present invention.

First Embodiment

Figure 1:
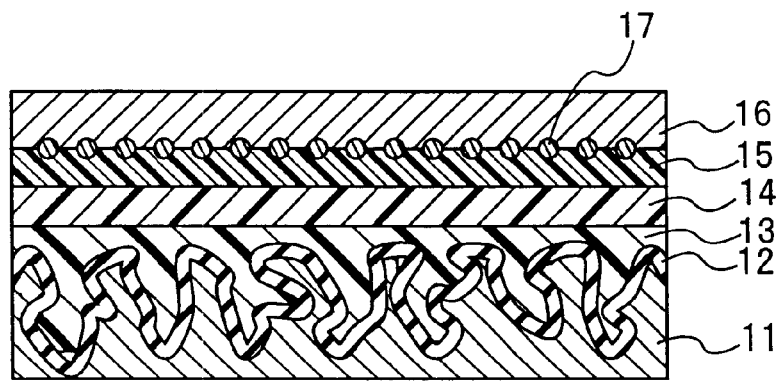
FIG. 1 is a cross-sectional view illustrating a schematic configuration of a capacitor unit according to an embodiment of the present invention.

FIG. 1 illustrates a schematic configuration of a capacitor unit according to the present embodiment. In FIG. 1, 11 denotes an anode-use valve metal foil, 12 denotes a dielectric layer, 13 denotes a first conductive polymer layer, 14 denotes a conductive adhesive layer, 15 denotes a second conductive polymer layer, 16 denotes a cathode-use charge collecting metal foil, and 17 denotes carbon particles. The anode-use valve metal foil 11 has surfaces roughened by electrolytic etching.

The following description will explain a configuration of a capacitor unit according to the present embodiment, along with a method for producing a capacitor unit according to an embodiment of the present invention.

First of all, for instance, by applying an alternating current to an aluminum foil with a purity of 99.99% and carrying out electrolytic etching on the aluminum foil in an electrolytic solution containing hydrochloric acid as a main component, surfaces of the aluminum foil are roughened, so that the anode-use valve metal foil 11 is formed. Subsequently, the anode-use valve metal foil 11 is subjected to anodic oxidation in a neutral electrolytic solution, so that the dielectric layer 12 having a certain breakdown voltage is formed on surfaces of the anode-use valve metal foil 11. Next, the first conductive polymer layer 13 made of polypyrrole, polythiophene, polyaniline, etc. is formed, for example, by chemical polymerization, or chemical polymerization and electrolytic polymerization in combination, from a solution containing a dopant and respective monomers.

On the other hand, as the cathode-use charge collecting metal foil 16, a Cu foil, a Ni-foil, or a foil obtained by embedding the carbon particles 17 in a surface part (surface part in contact with the second conductive polymer layer 15) of a Cu foil, a Ni foil, or an Al foil by compression is used. On the surface of the cathode-use charge collecting metal foil 16, the second conductive polymer layer 15 made of polypyrrole, polythiophene, polyaniline, etc. is formed by, for example, electrolytic polymerization with a solution containing a dopant and respective monomers.

Subsequently, for forming the conductive adhesive layer 14, a thermosetting resin in which conductive particles such as carbon particles or conductive polymer particles are dispersed is applied on at least one of the first conductive polymer layer 13 and the second conductive polymer layer 15, so that the both adhere to each other. Here, for instance, a pressure of $3.92 \times 10^6$ Pa to $1.47 \times 10^7$ Pa is applied, and the conductive adhesive layer 14 is hardened in a state of being laminated and compressed, so that an integral capacitor unit is provided.

In the capacitor unit and the producing method of the same according to the present invention, the anode-use valve metal foil 11 preferably is made of aluminum, tantalum, or niobium, but it is not limited to these, and any metal may be used as long as it is a valve metal foil. The method used for roughening the surfaces may be another method, such as direct current etching, etc.

Furthermore, to obtain as low an ESR as that of the lamination ceramic capacitor, it is effective to reduce an interface resistance between the cathode-use charge collecting metal foil 16 and the second conductive polymer layer 15, and to reduce an interface resistance between the first conductive polymer layer 13 or the second conductive polymer layer 15 and the conductive adhesive layer 14. The capacitor unit of the present invention is provided with the first conductive polymer layer 13 and the second conductive polymer layer 15 on the anode side and on the cathode side, respectively, which are made to adhere to each other via the conductive adhesive layer 14. Therefore, it is possible to compress the layers in the lamination direction, upon being integrated into a capacitor unit. By thus compressing the same, a contact area between the cathode-use charge collecting metal foil 16 and the second conductive polymer layer 15 is enlarged, whereby the interface resistance between the cathode-use charge collecting metal foil 16 and the second conductive polymer layer is decreased. Furthermore, in the capacitor unit of the present invention, to form the conductive adhesive layer 14 in contact with the first and second conductive polymer layers 13 and 15, a conductive adhesive 14 is used that is obtained by dispersing, in a resin, carbon particles or soft conductive polymer particles whose contact areas can be expanded. This causes the contact areas of the conductive adhesive 14 with the first or second conductive polymer layers 13 and 15 to increase, thereby causing the interface resistance to decrease. Furthermore, by hardening the conductive adhesive 14 in the compressed state, it is possible to maintain the state in which the contact areas are increased, and hence, to obtain a low ESR stably. Furthermore, by providing the conductive adhesive layer 14, it is possible to prevent the first and second conductive polymer layers 13 and 15 from being separated from each other. Furthermore, since the conductive adhesive 14 is thermosetting, the reliability with respect to heat is improved. Therefore, improved reliability of the integrally provided capacitor element also is obtained. It should be noted that the conductive adhesive 14 preferably is a thermosetting resin in which particles of carbon or a conductive polymer are dispersed. However, to form a capacitor unit, the conductive adhesive 14 is not limited to the above, and any conductive adhesive is usable.

Any metal foil may be used as the cathode-use charge collecting metal foil 16, but preferably it is a Cu foil or a Ni foil that has a low specific resistance, that allows the second conductive polymer layer 15 to be formed by electrolytic polymerization, and that can be soldered, or alternatively, a Cu foil, a Ni foil, or an aluminum foil in whose surface part (surface part in contact with the second conductive polymer layer 15) carbon particles 17 are embedded by compression so as to decrease an interface resistance.

As described above, in the capacitor unit of the present configuration, the interface resistance between the cathode-use charge collecting metal foil 16 and the second conductive polymer layer 15, and the interface resistance between the first and second conductive polymer layers 13 and 15 and the conductive adhesive layer 14 are reduced, so as to obtain a low ESR.

Figure 2:
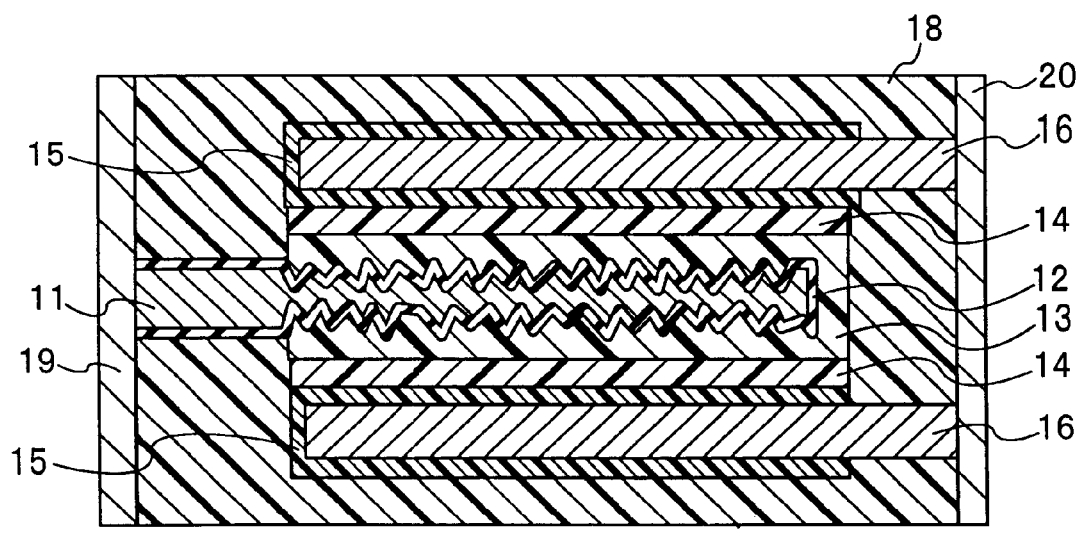
FIG. 2 is a cross-sectional view illustrating a schematic configuration of a solid electrolytic capacitor according to an embodiment of the present invention.

FIG. 2 illustrates a solid electrolytic capacitor provided with a capacitor unit according to the present embodiment, as an embodiment of an electrolytic capacitor of the present invention. In FIG. 2, 18 denotes a molding material, 19 denotes an anode terminal, and 20 denotes a cathode terminal.

A solid electrolytic capacitor shown in FIG. 2 includes a capacitor unit in which two capacitor units shown in FIG. 1 are provided on both sides; that is, the solid electrolytic capacitor includes a capacitor unit obtained by causing one piece of the anode-use valve metal foil 11 provided with the first conductive polymer layer 13, and two pieces of the charge collecting metal foils 16 provided with the second conductive polymer layer 15, to adhere each other with the conductive adhesive 14 in a compressed state so that the whole is integrally provided. This capacitor unit, for instance, is molded with a liquid-epoxy-type molding material 18 containing silicon oxide as a filler, and the anode-use valve metal foil 11 and the cathode-use charge collecting metal foils 16 are exposed by grinding ends of the capacitor unit. Then, the anode terminal 19 and the cathode terminal 20 are formed by plating Ni, or formed with a conductive paste. Thus, a solid electrolytic capacitor according to the present embodiment is obtained.

It should be noted that in the present embodiment, one piece of the anode-use valve metal foil 11 and two pieces of the cathode-use charge collecting metal foils 16 are laminated, with the conductive layers 13 and 15 and the conductive adhesive layers 14 interposed therebetween. However, it may be configured so that a plurality of laminations of the anode-use valve metal foils 11 and the cathode-use charge collecting metal foils 16 may be formed, with the conductive polymer layers 13 and the conductive adhesive layers 14 interposed therebetween. Furthermore, the configurations of the anode terminal 19 and the cathode terminal 20 are not limited to the above-described configurations. Besides, the method for molding the molding material 18 is not limited to the molding with a liquid molding material, but it may be formed by transfer molding.

Since in the solid electrolytic capacitor in accordance with the present embodiment, as described above, the capacitor unit having decreased interface resistances between the cathode-use charge collecting metal foil 16 and the second conductive polymer layer 15 and between the first and second conductive polymer layers 13 and 15 and the conductive adhesive layers 14 is used, it is possible to reduce the ESR to a level as low as that of a multilayer ceramic capacitor.

Second Embodiment

FIG. 3 is a schematic configuration of a solid electrolytic capacitor as an embodiment of an electrolytic capacitor of the present invention. In FIG. 3, 21 denotes a rubber elastic body. It should be noted that the same members as those described in the first embodiment are designated by the same reference numerals, and descriptions of the same are omitted herein.

A solid electrolytic capacitor according to the present embodiment is obtained by laminating a plurality of the capacitor units shown in FIG. 2. In other words, the solid electrolytic capacitor according the present embodiment includes laminated capacitor units (hereinafter referred to as capacitor unit lamination) obtained by causing two pieces of the anode-use valve metal foils 11 provided with the first conductive polymer layers 13, and three pieces of the charge collecting metal foils 16 provided with the second conductive polymer layers 15 to adhere to each other with the conductive adhesive 14 in a compressed state so that the whole is integrally provided.

Furthermore, in the foregoing solid electrolytic capacitor, sheet-like elastic bodies 21, for example, made of rubber such as styrene butadiene rubber (SBR), are fixed to an upper surface and a lower surface of the capacitor unit lamination, with an adhesive or the like. It should be noted that the elastic body is not limited to rubber, and a foamed resin sheet may be used, for instance.

The capacitor unit lamination provided with the rubber elastic bodies 21 on the upper and lower surfaces as described above is subjected to transfer molding with an epoxy-type molding material 18 containing silicon oxide as a filler. The anode-use valve metal foils 11 and the cathode-use charge collecting metal foils 16 are exposed by grinding ends of the molding material 18. Then, the anode terminal 19 and the cathode terminal 20 are formed by plating Ni, or formed with a conductive paste. Thus, a solid electrolytic capacitor according to the present embodiment is obtained. It should be noted that the configurations of the anode terminal 19 and the cathode terminal 20 are not limited to the above-described configurations. Besides, the method for molding the molding material 18 is not limited to the transfer molding, but a liquid molding resin may be poured into a mold and cured by heat.

In the solid electrolytic capacitor according to the present embodiment, the curing and shrinkage of the molding material 18 applies stress to the rubber elastic bodies 21, which then compresses the capacitor unit lamination in the lamination direction. Therefore, more stable interface connection can be achieved against thermal stress. Though the foregoing description takes as an example a case in which the rubber elastic bodies 21 are provided on a solid electrolytic capacitor in which a plurality of capacitor units are laminated, the rubber elastic bodies 21 may be provided on a configuration in which a plurality of capacitor units are not laminated. In this case as well, the same effects as those in the present embodiment can be achieved.

EXAMPLES

The following description will depict the present invention in more detail, while showing examples.

Example 1

In Example 1 of the present invention, a capacitor unit and a solid electrolytic capacitor shown in the first embodiment were produced.

To form an anode-use valve metal foil 11, an aluminum foil with a purity of 99.99% and a thickness of 100 $\mu$m was used. Both surfaces of the aluminum foil were subjected to electrolytic etching in an electrolytic solution mainly containing hydrochloric acid at a concentration of 10 wt % at a liquid temperature of 35° C., with alternating current applied thereto, so that the surfaces were roughened. The rough surface layers in the aluminum foil had a thickness of 40 $\mu$m each. Subsequently, the aluminum foil was bored, so that the anode-use valve metal foil 11 was obtained. In order to separate a part where a first conductive polymer layer 13 was to be formed, an insulation tape was applied to a part of the anode-use valve metal foil 11, so that a 3.5-mm square effective portion where a capacitor was to be formed was obtained. The anode-use valve metal foil 11 was subjected to constant voltage forming at a forming voltage of 8 V in a 5 wt % ammonium adipate aqueous solution as an anodic oxidation solution at a liquid temperature of 60° C., so that a dielectric layer 12 was formed on surfaces of the anode-use valve metal foil 11.

Subsequently, a solution containing a thiophene monomer, an iron-based oxidant, and a dopant was dropped on a surface of the anode-use valve metal foil 11 where a capacitor part was to be formed (the aforementioned 3.5 mm square surface portion), so that a conductive polymer layer 13 was formed thinly by chemical polymerization. Thereafter, the thickness of the conductive polymer layer 13 was increased by electrolytic polymerization.

On the other hand, as a cathode-use charge collecting metal foil 16, an aluminum foil having roughened surfaces in which carbon particles were embedded by compression or the like was used. Electrolytic polymerization was carried out in an electrolytic solution containing a thiophene monomer and a dopant, so that a second conductive polymer layer 15 was formed on the cathode-use charge collecting metal foil 16.

Subsequently, a conductive adhesive 14 made of graphite and an epoxy resin was applied over the first conductive polymer layer 13, and the anode-use valve metal foil 11 and the cathode-use charge collecting metal foil 16 were laminated so that the first conductive polymer layer 13 and the second conductive polymer layer 15 were facing each other. Herein, one piece of the anode-use valve metal foil 11 was interposed between two pieces of the cathode-use charge collecting metal foils 16, and the whole was subjected to a pressure of $9.8 \times 10^6$ Pa at a temperature of 120° C. in a nitrogen atmosphere, so that the conductive adhesive layer 14 was cured in the compressed state. Consequently, an integral capacitor unit was obtained. Then, the obtained capacitor unit was put inside a polytetrafluoroethylene old. A molding material 18 of a liquid epoxy type containing an inorganic filler as poured into spaces between the mold and the capacitor unit in a nitrogen atmosphere, and was cured, whereby the capacitor unit was sealed. Then, the capacitor unit was cut out in a sealed state with the molding material.

Subsequently, portions of the anode-use valve metal foil 11 and the cathode-use charge collecting metal foil 16 to be connected with an anode terminal 19 and a cathode terminal 20 were exposed by grinding, subjected to Zn substitution, and plated with Ni. The Ni plated portions further were electroplated with Cu, and thus the anode terminal 19 and the cathode terminal 20 were formed.

Subsequently, in aging, the sealed capacitor unit was caused to absorb moisture in an atmosphere of 80% RH at a temperature of 80° C., and a constant voltage was applied thereto so as to repair the dielectric layer 12. Then, it was dried, whereby a solid electrolytic capacitor was obtained.

The solid electrolytic capacitor of the present example produced as above had a capacitance of about 14 $\mu$F at a frequency of 120 Hz, according to measurement of the frequency characteristics with an LCR meter. An ESR of the same was measured to be about 2 m$\Omega$ to 3 m$\Omega$ at a frequency of 100 kHz. In the case where the solid electrolytic capacitor of the present example twice was subjected to a solder reflowing test with a peak temperature of 260° C. for 10 sec, substantially no change was seen in the ESR value thereof.

FIG. 4 illustrates an example of the relationship between the pressure upon the bonding with the conductive adhesive layer 14 and the ESR. As seen in FIG. 4, when the pressure is greater than $3.92 \times 10^6$ Pa, an ESR of not more than 10 m$\Omega$ is obtained, which is in a range where the ESR is stable, that is, a range in which the ESR does not vary greatly. Therefore, by curing the conductive adhesive under a pressure not smaller than a predetermined value with which a small stable ESR value is obtained, a capacitor unit and a solid electrolytic capacitor with low and stable ESR values can be obtained.

Example 2

In Example 2 of the present invention, a solid electrolytic capacitor shown in the second embodiment was produced.

To form an anode-use valve metal foil 11, an aluminum foil with a purity of 99.99% and a thickness of 100 $\mu$m was used. Both surfaces of the aluminum foil were subjected to electrolytic etching in an electrolytic solution mainly containing hydrochloric acid at a concentration of 10 wt % at a liquid temperature of 35° C., with alternating current applied thereto, so that the surfaces were roughened. The rough surface layers in the aluminum foil had a thickness of 40 $\mu$m each.

Subsequently, the aluminum foil was bored, so that the anode-use valve metal foil 11 was obtained. In order to separate a part where a first conductive polymer layer 13 was to be formed, an insulation tape was applied to a part of the anode-use valve metal foil 11, so that a 3.5-mm square effective portion where a capacitor was to be formed was obtained. The anode-use valve metal foil 11 was subjected to constant voltage forming at a forming voltage of 8 V in a 5 wt % ammonium adipate aqueous solution as an anodic oxidation solution at a liquid temperature of 60° C., so that a dielectric layer 12 was formed on surfaces of the anode-use valve metal foil 11.

Subsequently, a solution containing a thiophene monomer, an iron-based oxidant, and a dopant was dropped on a surface of the anode-use valve metal foil 11 where a capacitor part was to be formed (the aforementioned 3.5 mm square surface portion), so that a conductive polymer layer 13 was formed thinly by chemical polymerization. Thereafter, the thickness of the conductive polymer layer 13 was increased by electrolytic polymerization.

On the other hand, as a cathode-use charge collecting metal foil 16, an aluminum foil having roughened surfaces in which carbon particles were embedded by compression or the like was used. Electrolytic polymerization was carried out in an electrolytic solution containing a thiophene monomer and a dopant, so that a second conductive polymer layer 15 was formed on the cathode-use charge collecting metal foil 16.

Subsequently, a conductive adhesive 14 made of graphite and an epoxy resin was applied over the first conductive polymer layer 13, and the anode-use valve metal foil 11 and the cathode-use charge collecting metal foil 16 were laminated so that the first conductive polymer layer 13 and the second conductive polymer layer 15 were facing each other. Herein, two piece of the anode-use valve metal foil 11 was interposed between three pieces of the cathode-use charge collecting metal foils 16, and the whole was subjected to a pressure of $9.8 \times 10^6$ Pa at a temperature of 120° C. in a nitrogen atmosphere, so that the conductive adhesive layer 14 was cured in the compressed state. Consequently, an integral capacitor unit lamination was obtained.

Then, rubber elastic bodies 21 made of sheet-like SBR were fixed on upper and lower surfaces of the capacitor unit lamination.

Subsequently, the capacitor unit lamination provided with the rubber elastic bodies 21 was put inside a polytetrafluoroethylene mold. A molding material 18 of a liquid epoxy type containing an inorganic filler was poured into spaces between the mold and the capacitor unit in a nitrogen atmosphere, and was cured, whereby the capacitor unit lamination and the rubber elastic bodies 21 was sealed. Then, the capacitor unit was cut out in a sealed state with the molding material.

Subsequently, portions of the anode-use valve metal foil 11 and the cathode-use charge collecting metal foil 16 to be connected with an anode terminal 19 and a cathode terminal 20, respectively, were exposed by grinding, subjected to Zn substitution, and plated with Ni. The Ni plated portions further were electroplated with Cu, and thus the anode terminal 19 and the cathode terminal 20 were formed.

Subsequently, in aging, the sealed capacitor unit was caused to absorb moisture in an atmosphere of 80% RH at a temperature of 80° C., and a constant voltage was applied thereto so as to repair the dielectric layer 12. Then, it was dried, whereby a solid electrolytic capacitor was obtained.

The solid electrolytic capacitor of the present example produced as above had a capacitance of about 28 $\mu$F at a frequency of 120 Hz, according to measurement of the frequency characteristic with an LCR meter. An ESR of the same was measured to be about 2 m$\Omega$ at a frequency of 100 kHz. In the case where the solid electrolytic capacitor of the present example was subjected five times to a solder reflowing test with a peak temperature of 260° C. for 10 sec, substantially no change was seen in the ESR value thereof.

Comparative Example

Figure 5:
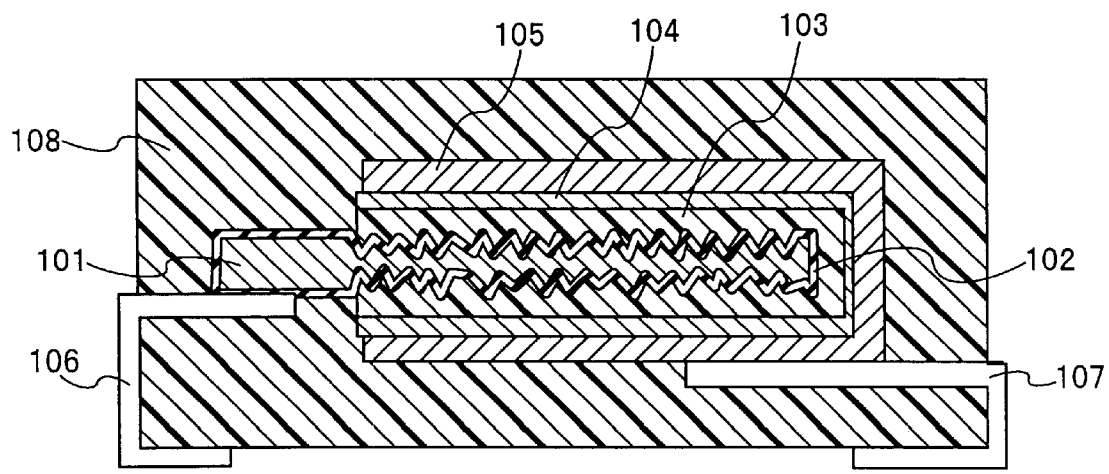
FIG. 5 is a cross-sectional view illustrating a schematic configuration of a conventional specialty polymer aluminum electrolytic capacitor.

As a comparative example, the conventional specialty polymer electrolytic capacitor shown in FIG. 5 was produced.

As an anode-use aluminum foil 101 an aluminum foil with a purity of 99.99% and a thickness of 100 μm was used. Both surfaces of the aluminum foil were subjected to electrolytic etching in an electrolytic solution mainly containing hydrochloric acid at a concentration of 10 wt % at a liquid temperature of 35° C., with alternating current applied thereto, so that the surfaces were roughened. The rough surface layers in the aluminum foil had a thickness of 40 μm each.

Subsequently, the aluminum foil was bored, so that the anode-use aluminum foil 101 was obtained. In order to separate a part where a conductive polymer layer 103 was to be formed, an insulation tape was applied to a part of the anode-use aluminum foil 101, so that a 3.5-mm square effective portion where a capacitor was to be formed was obtained. The anode-use aluminum foil 101 was subjected to constant voltage forming at a forming voltage of 8 V in a 5 wt % ammonium adipate aqueous solution as an anodic oxidation solution at a liquid temperature of 60° C., so that a dielectric layer 102 was formed on surfaces of the anode-use aluminum foil 101.

Subsequently, a solution containing a thiophene monomer, an iron-based oxidant, and a dopant was dropped on a surface of the anode-use aluminum foil 101 where a capacitor part was to be formed (the aforementioned 3.5 mm square surface portion), so that a conductive polymer layer 103 was formed thinly by chemical polymerization. Thereafter, the thickness of the conductive polymer layer 103 was increased by electrolytic polymerization.

Subsequently, a carbon layer 104 and an Ag paste 105 were formed by dipping and forming.

Then, an anode terminal 106 was welded to the anode-use aluminum foil 101, and a cathode terminal 107 was bonded to the Ag paste layer 106. Thereafter, a molding resin 108 was molded by transfer molding.

Finally, the obtained capacitor unit was caused to absorb moisture in an atmosphere of 80% RH at a temperature of 80° C., and a constant voltage was applied thereto so as to repair a dielectric layer 102. Then, it was dried, whereby a solid electrolytic capacitor was obtained. The solid electrolytic capacitor of the present example produced as above had a capacitance of about 14 μF at a frequency of 120 Hz, according to measurement of the frequency characteristic with an LCR meter. An ESR of the same was measured to be about 20 mΩ at a frequency of 100 kHz, which is greater than that of the solid electrolytic capacitors of Examples 1 and 2.

Thus, it was confirmed that the configurations of the capacitor unit, the solid electrolytic capacitor, and the methods for producing the same according to Examples 1 and 2 allows the ESR to decrease, as compared with that of the conventional capacitor unit and the solid electrolytic capacitor.

Furthermore, by incorporating the solid electrolytic capacitor inside a circuit substrate, it is possible to obtain a capacitor-incorporated circuit substrate with a low ESR value.

As described above, the configurations of the capacitor unit and the solid electrolytic capacitor of the present invention allow various interface resistances to decrease while being produced without complex steps in the producing process, thereby allowing the ESR to decrease to a level as low as the ESR of the multilayer ceramic capacitor.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A capacitor unit comprising:

a valve metal element for an anode, having a rough surface;

a dielectric layer provided on the surface of the valve metal element for an anode;

a conductive layer for a cathode, provided on the dielectric layer; and a charge collecting metal element for a cathode provided on the conductive layer for a cathode, wherein the conductive layer for a cathode comprises three layers that are a first conductive polymer layer, a second conductive polymer layer, and a conductive adhesive layer interposed between the first and second conductive polymer layers.

2. The capacitor unit according to claim 1, wherein the conductive adhesive layer is made of a thermosetting resin in which conductive particles are dispersed.

3. The capacitor unit according to claim 1, wherein the valve metal element for an anode is made of one of an aluminum foil, a tantalum foil, and a niobium foil.

4. The capacitor unit according to claim 1, wherein the charge collecting metal element for a cathode is made of a metal foil in which carbon particles are embedded so as to be exposed on the surface of the metal foil.

5. A method for producing the capacitor unit according to claim 1, comprising: forming the first conductive polymer layer on the dielectric layer formed on the surface of the valve metal element for an anode;

forming the second conductive polymer layer on a surface of the charge collecting metal element for a cathode;

applying a conductive adhesive over at least one of the first conductive polymer layer and the second conductive polymer layer; and laminating the valve metal element for anode and the charge collecting metal element for cathode so that the first conductive polymer layer and the second conductive polymer layer face each other via the conductive adhesive, and curing the conductive adhesive in a state of being compressed in a lamination direction.

6. A solid electrolytic capacitor comprising:

at least one capacitor unit according to claim 1;

a molding material for molding the capacitor unit;

an anode terminal connected with the valve metal element for an anode; and a cathode terminal connected with the charge collecting metal element for a cathode.

7. The solid electrolytic capacitor according to claim 6, wherein:

a plurality of the capacitor units are laminated, constituting a capacitor unit lamination.

8. The solid electrolytic capacitor according to claim 6, wherein elastic bodies are provided between at least one of upper and lower surfaces of the capacitor unit and the molding material.

9. The solid electrolytic capacitor according to claim 7, wherein elastic bodies are provided between at least one of upper and lower surfaces of the capacitor unit lamination and the molding material.

* * * * *